(12) United States Patent
Coolbaugh et al.

(10) Patent No.: US 7,160,772 B2
(45) Date of Patent: Jan. 9, 2007

(54) STRUCTURE AND METHOD FOR INTEGRATING MIM CAPACITOR IN BEOL WIRING LEVELS

(75) Inventors: Douglas D. Coolbaugh, Essex Junction, VT (US); Vidhya Ramachandran, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 110 days.

(21) Appl. No.: 10/906,521

(22) Filed: Feb. 23, 2005

(65) Prior Publication Data

US 2006/0189069 A1 Aug. 24, 2006

(51) Int. Cl.
*H01L 21/8242* (2006.01)

(52) U.S. Cl. .............. 438/243; 438/439; 438/329; 438/393; 438/396; 257/E21.009; 257/E21.011

(58) Field of Classification Search ................. 438/329
See application file for complete search history.

(56) References Cited

U.S. PATENT DOCUMENTS

| | | | |
|---|---|---|---|
| 6,624,040 B1 | 9/2003 | Ng et al. | |
| 6,670,237 B1 | 12/2003 | Loh et al. | |
| 6,825,075 B1 | 11/2004 | Petrarca et al. | |
| 2002/0197815 A1* | 12/2002 | Yoshitomi | 438/396 |
| 2003/0025143 A1* | 2/2003 | Lin et al. | 257/303 |
| 2004/0104420 A1 | 6/2004 | Coolbaugh et al. | |
| 2004/0251514 A1 | 12/2004 | Abadeer et al. | |

* cited by examiner

*Primary Examiner*—Michael Lebentritt
*Assistant Examiner*—Kyoung Lee
(74) *Attorney, Agent, or Firm*—Cantor Colburn LLP

(57) ABSTRACT

A method for integrating a metal-insulator-metal (MIM) capacitor in back end of line (BEOL) wiring levels of a semiconductor device includes forming an isolating layer over a lower wiring level, forming a bottom electrode of the capacitor on the isolating layer, and forming an interlevel dielectric material on the isolating layer and the bottom electrode. A capacitor dielectric is formed on the bottom electrode and a top electrode of the capacitor is formed on the capacitor dielectric, wherein the top electrode is formed concurrently with an upper wiring level, the upper level being the next successive wiring level with respect to the lower wiring level.

8 Claims, 5 Drawing Sheets

STRUCTURE AND METHOD FOR INTEGRATING MIM CAPACITOR IN BEOL WIRING LEVELS

BACKGROUND

The present invention relates generally to semiconductor device manufacturing, and, more particularly, to a structure and method for integrating a metal-insulator-metal (MIM) capacitor in back end of line (BEOL) wiring levels of a semiconductor integrated circuit.

In many mixed signal or high frequency RF applications, both high performance, high-speed capacitors and inductors are utilized. Low series resistance, low loss, high Q and low (RC) time constants are characteristic of such components in high frequency applications for achieving high performance. In addition, these device structures are fabricated by processes compatible with CMOS processing (e.g., using AlCu alloys to pure copper in dual damascene structures).

In particular, a metal-insulator-metal (MIM) capacitor is commonly used in high performance applications in CMOS technology. Typically, the MIM capacitor has a sandwich structure and can be described as a parallel plate capacitor. The capacitor top metal (CTM) is separated from the capacitor bottom metal (CBM) by a thin insulating dielectric layer. Both parallel plates are typically formed from Al or AlCu alloys that are patterned and etched through the use of several photolithography photomasking steps. The thin insulating dielectric layer is typically made from silicon oxide or silicon nitride, deposited by chemical vapor deposition (CVD), for example.

Damascene processing is a common method for fabricating planar copper interconnects. Damascene wiring interconnects (and/or studs) are formed by depositing a dielectric layer on a planar surface, patterning the dielectric layer using photolithography and reactive ion etching (RIE), and then filling the formed recesses with conductive metal. The excess metal is then removed by chemical mechanical polishing (CMP), leaving the troughs or channels filled with metal. For example, damascene wiring lines may be used to form bit lines in DRAM devices, with processing similar to the formation of tungsten (W) studs in the logic and DRAM devices. In both examples, sputtered Ti/TiN liners (underlying diffusion barriers) are coated with chemical vapor deposited (CVD) W metal, then polished back to the oxide.

In a dual damascene process, a monolithic stud/wire structure is formed from the repeated patterning of a single thick oxide film, followed by metal filling and CMP. First, a relatively thick oxide layer is deposited on a planar surface. The oxide thickness may be slightly larger than the desired final thickness of the stud and wire, since a small amount of oxide is removed during CMP. Stud (via) recesses are formed in the oxide using photolithography and RIE that either partially etches through the oxide or traverses the oxide and stops on the underlying metal to be contacted. The wire recesses can then be formed using a separate photolithography step and a timed oxide etching step. If the former stud RIE option is used, the wire etching completes the drilling of the stud holes. Next, the stud/wire metallization is deposited, and then planarized using CMP. The resulting interconnects are produced with fewer process steps than with conventional single damascene processing. Moreover, with a dual damascene process, two layers of metal are formed simultaneously (e.g., a wiring line and contact stud vias), thus avoiding an interface therebetween.

In the fabrication of semiconductor devices, metal lines are often embedded in dielectric layers in a multilevel structure, particularly in the latter stages (referred to as "back end of the line" or "BEOL") of the fabrication process. However, with the continued scaling of semiconductor technologies, narrower linewidths are accompanied by features shrinking in the direction perpendicular to the wafer. For example, in BEOL structures, vias and wires become shorter so that they can be patterned with thinner resists to achieve narrower linewidths. As the space between two successive line levels becomes smaller, devices such as MIM capacitors (which fit in between two wiring levels), become more difficult to fabricate since there is less headroom therebetween. In addition, existing schemes for forming MIM capacitors are dependent on successfully landing vias at different heights (e.g., on the top plate, the bottom plate and the prior level Cu wire) with a single via reactive ion etch (RIE) step.

In technologies such as CMOS 9SF, a MIM capacitor is placed between formed at about twice the thickness (2×) of the thinnest wiring level(s). In this case, the via landing on the top plate lands about 3000 angstroms (Å) above the via on the Cu wire underneath. This leads to a requirement of extreme selectivity of the RIE process to the top plate material. Eventually, in future 11SF technology, a situation will be reached in which the conventional MIM capacitor structure can no longer be placed between 2× thickness wires, since the via height therebetween is now less than the MIM capacitor stack height.

One way to address this situation would be to implement a single mask scheme, wherein a dielectric followed by the top-plate metal is deposited directly over the copper. A single mask is then used to pattern the top-plate. With this approach, the resulting stack height would be less with respect to a conventional configuration, since there is no need to include either the isolation barrier or the bottom plate in the MIM capacitor stack. In other words, the bottom plate of the MIM capacitor becomes part of the Cu wiring level itself. Unfortunately, the direct exposure of dielectric to copper means that oxide materials cannot be used as the capacitor dielectric material (as it would attack the copper), thus ruling out the very attractive high-K materials for capacitor dielectrics.

Furthermore, using a damascene copper plate places an upper limit on the size of the plate, additionally compromising the surface quality and planarity of the Cu electrode (due dishing, scratches, etc., following CMP). Moreover, for existing MIM capacitor integration schemes in which the top plate is placed in the interlevel dielectric (ILD) and has a different height via landing thereupon, an extremely selective via RIE process is needed to prevent etching through the top plate and resulting in yield or reliability problems. The edge of the top plate of the MIM capacitor is a weak point in these integration schemes because the top plate RIE endpoints in the underlying dielectric, leading to RIE damage, microtrenching and local thinning of the dielectric.

Accordingly it would be desirable to be able to flexibly integrate a MIM capacitor between BEOL wiring levels for semiconductors devices with decreasing vertical heights, and in a manner that does not undesirably limit the choice of MIM capacitor dielectrics.

SUMMARY

The foregoing discussed drawbacks and deficiencies of the prior art are overcome or alleviated by a method for integrating a metal-insulator-metal (MIM) capacitor in back end of line (BEOL) wiring levels of a semiconductor device. In an exemplary embodiment, the method includes forming an isolating layer over a lower wiring level, forming a bottom electrode of the capacitor on the isolating layer, and forming an interlevel dielectric material on the isolating layer and the bottom electrode. A capacitor dielectric is formed on the bottom electrode and a top electrode of the capacitor is formed on the capacitor dielectric, wherein the top electrode is formed concurrently with an upper wiring level, the upper level being the next successive wiring level with respect to the lower wiring level.

In another embodiment, a MIM capacitor for BEOL wiring levels of a semiconductor device includes a bottom electrode disposed over and isolated from a lower wiring level, a capacitor dielectric formed on the bottom electrode and a top electrode formed on the capacitor dielectric. The top electrode is integrated with an upper wiring level, the upper level being the next successive wiring level with respect to the lower wiring level.

BRIEF DESCRIPTION OF THE DRAWINGS

Referring to the exemplary drawings wherein like elements are numbered alike in the several Figures.

DETAILED DESCRIPTION

Disclosed herein is a structure and method for integrating a MIM capacitor in BEOL wiring levels of a semiconductor device. Briefly stated, the bottom plate of the MIM capacitor is isolated over a lower wiring level by interlevel dielectric material, while the top plate is patterned and formed by damascene processing so as to be integrated within an upper wiring level. Because additional dielectric is not used to isolate the top plate from the upper wiring level, the MIM capacitor may be fitted between thin wiring levels, but still formed atop an insulative material for dielectric flexibility.

Figure 1A:
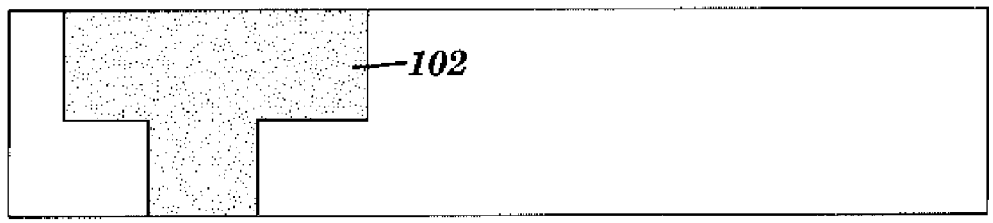
FIGS. 1(a) through 1(k) are process flow diagrams illustrating a structure and method for integrating a MIM capacitor in BEOL wiring levels of a semiconductor device, in accordance with an embodiment of the invention.
Figure 1B:
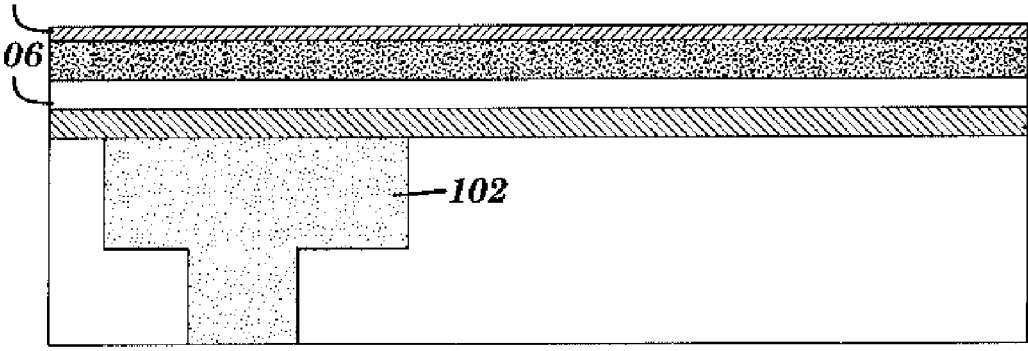

Referring initially to FIG. 1(a), there is shown an exemplary semiconductor device 100 following the completion (trough etch, liner deposition, metal fill, planarization, etc.) of a first (lower) wiring level 102. A capping layer 104 is formed atop the first wiring level 102 and surrounding interlevel dielectric, as shown in FIG. 1(b). FIG. 1(b) further illustrates the formation of the materials used for the bottom plate of the MIM capacitor. Following the deposition of an isolating layer 106 (e.g., oxide, SiCOH) over the capping layer 104, the bottom plate electrode metal 108 (e.g., TiN) is deposited over the isolating layer 106. In lieu of forming isolating layer 106, the capping layer 104 could alternatively be formed at a sufficient thickness so as to provide the desired isolation from the lower wiring level 102. In either case, the bottom plate metal 108 is then covered by a barrier layer 110 (such as NBLoK or nitride, for example) that will serve as a subsequent etch stop layer for the capacitor trench formation.

Figure 1C:
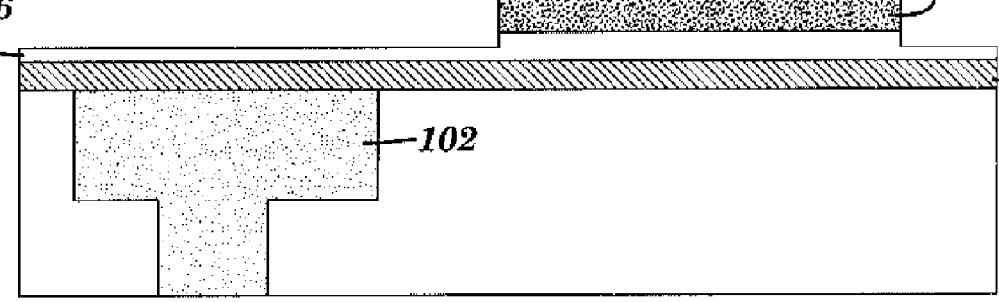
Figure 1D:
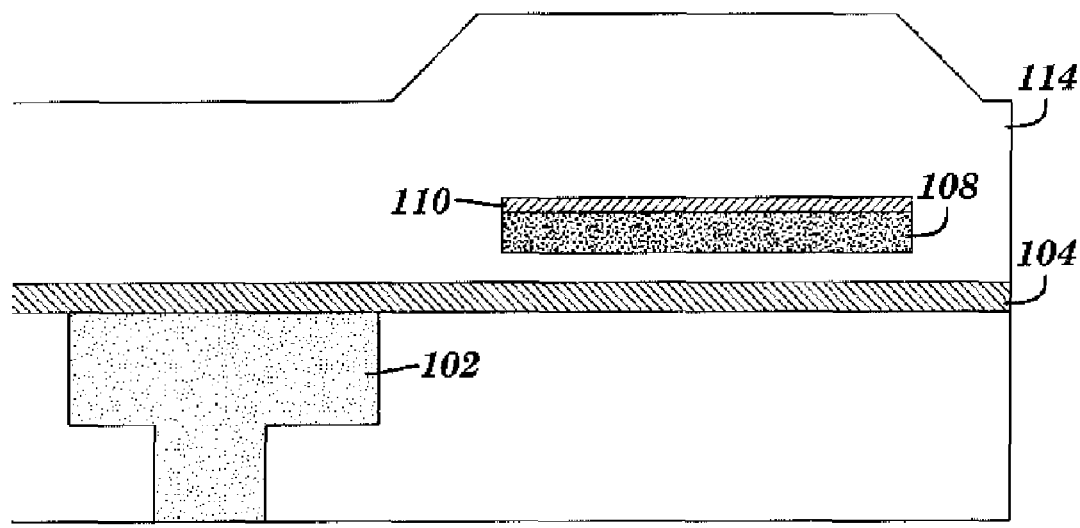
Figure 1E:
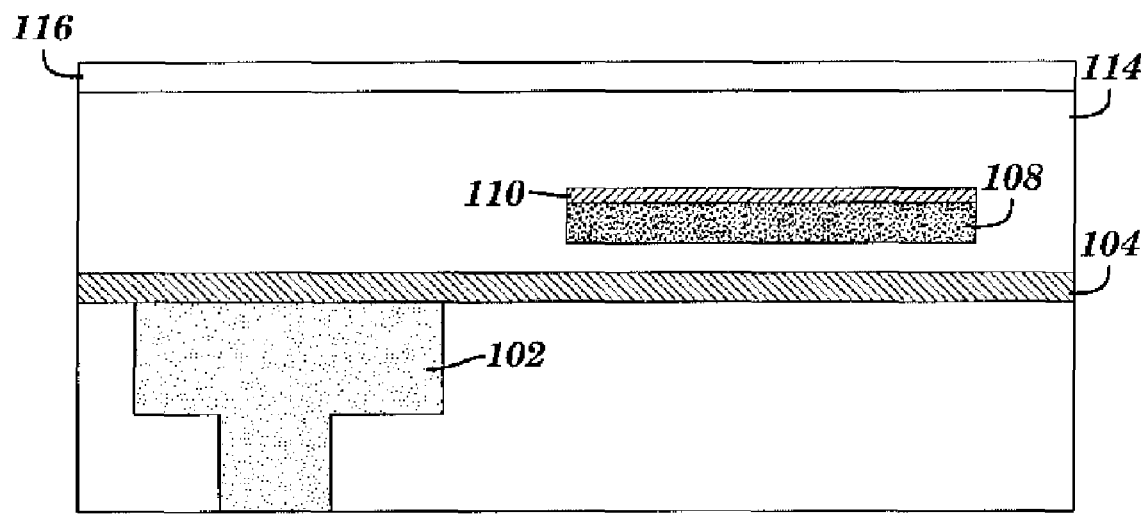

As shown in FIG. 1(c), the bottom plate 108 is patterned using a resist material 112. Since the MIM capacitor is a relative large structure with respect to other structures of the semiconductor device, a mid-UV (MUV) mask is suitable for use, along with a thick layer of resist for the bottom plate patterning. It is further noted that, as is the case for an existing MIM capacitor structure, no metal fill or dummy shapes are present beneath the bottom plate 108. FIG. 1(d) illustrates the formation of an interlevel dielectric (ILD) layer 114 over the capping layer 104 and bottom plate 108/barrier layer 110 stack. The resulting topography from the patterned bottom plate 108 is subsequently planarized, as shown in FIG. 1(e). Depending on the extent of the ILD material removed during planarization, an additional insulating cap 116 may be formed over the planarized ILD layer 114. The cap may be the same material as the ILD material, or it may also be a different insulating material. The deposition of a cap material advantageously masks CMP damage that may otherwise be replicated into the next damascene layer as defects. For ease of illustration, the ILD layer 114 and post-planarization cap 116 are simply shown as ILD layer 114 hereinafter.

Figure 1F:
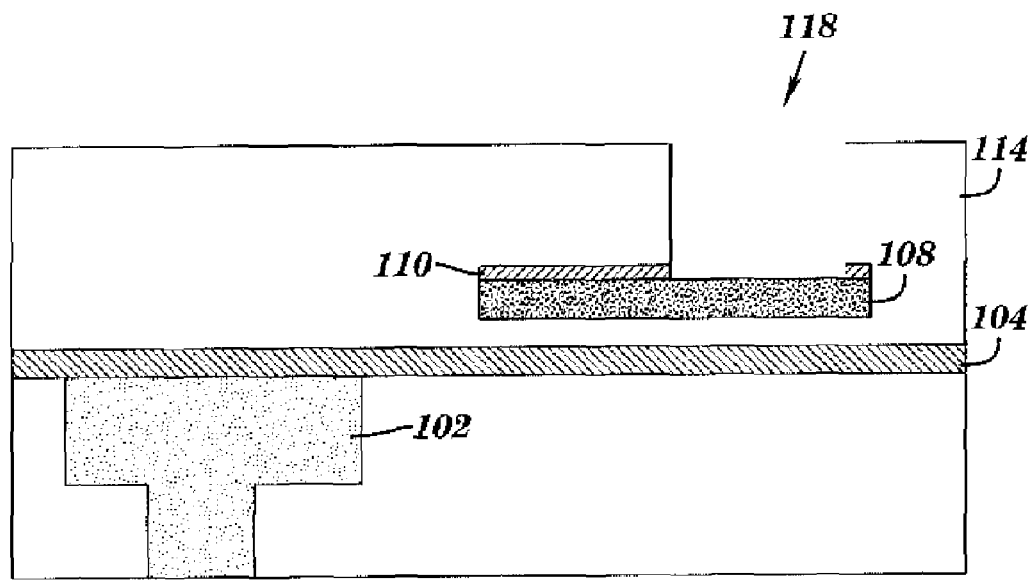
Figure 1G:
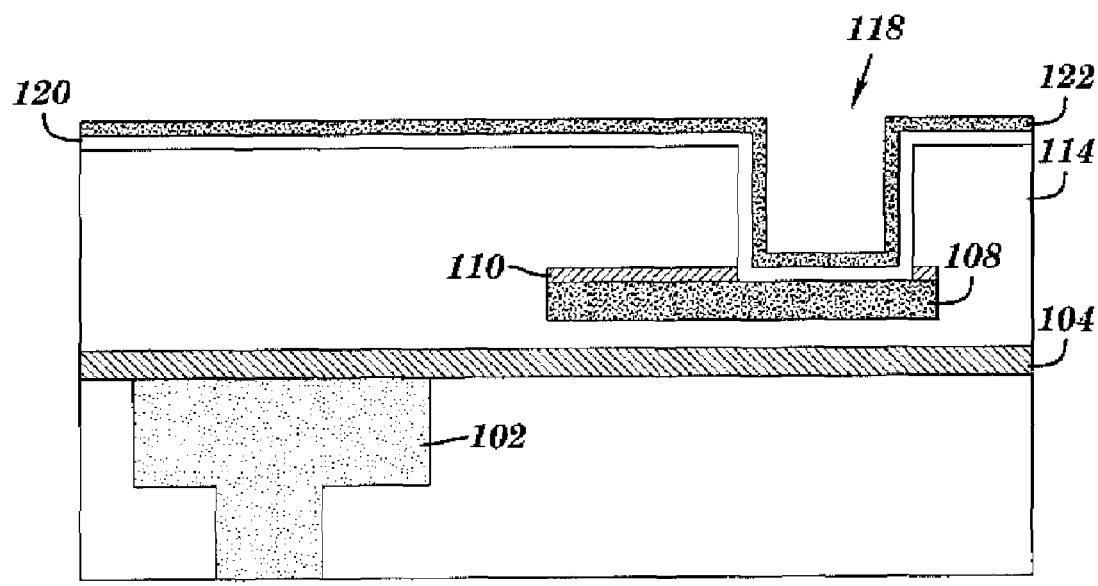

Proceeding now to FIG. 1(f), the patterning for the capacitor dielectric and top plate formation is shown. An MUV mask may again be used for the patterning of the capacitor trench 118, wherein the barrier layer 110 is an etch stop for the ILD removal. Another etch step can then be used to remove the exposed portions of the barrier layer 110, stopping on the bottom plate 108. Although FIG. 1(f) depicts a complete removal of the ILD material 114 from the trench 118, it will be appreciated that some small density fill may be left behind through appropriate patterning so as to reduce dishing of the top MIM capacitor electrode during a later copper planarization step. Then, as shown in FIG. 1(g), a capacitor dielectric 120 is formed over the device surface, including the sidewall surfaces and bottom of the trench 118. A protective liner of conductive material 122 (e.g., TiN) is deposited over the capacitor dielectric 120 so as to prevent damage thereto during subsequent processing and, being conductive, will define a portion of the top electrode. As indicated previously, the processing embodiments herein allow for the flexibility in the choice of capacitor dielectric material (e.g., silicon nitride, silicon oxide, aluminum oxide, Hi-K oxides such as hafnium oxide and barium strontium titanate).

Figure 1H:
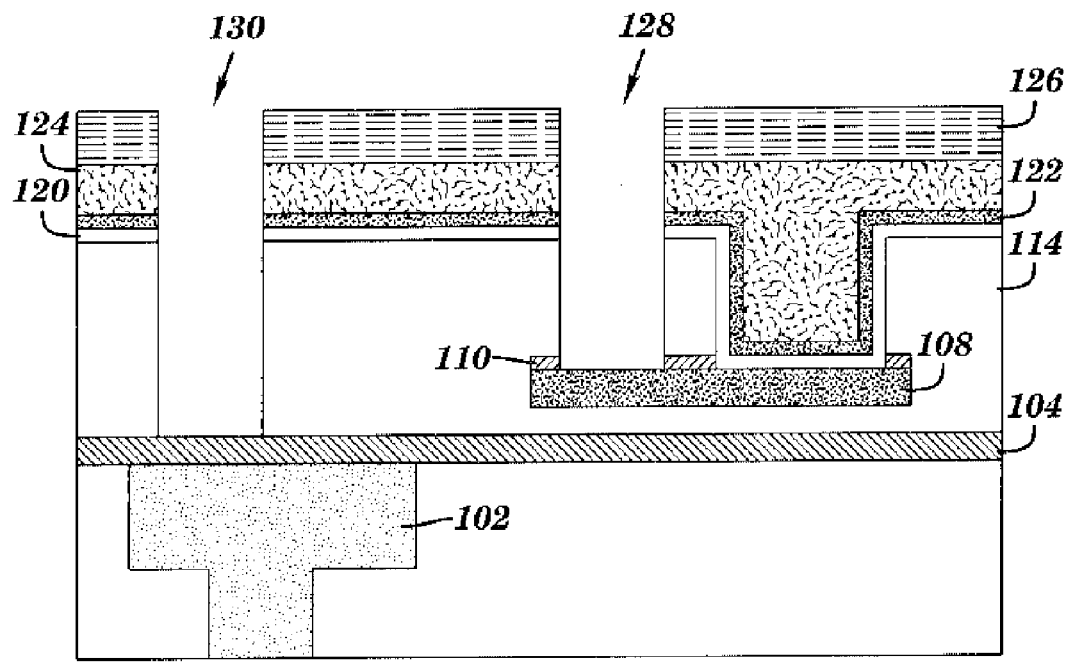

Following the completion of the capacitor trench definition, dielectric and protective liner, a lithography and etch process is implemented to both define the vias for connecting the lower wiring level 102 to the subsequently formed upper wiring level, as well as a via for connecting the bottom plate 108 to the upper wiring level. This is shown in FIG. 1(h). Because of the formation of the capacitor trench 118, a planarizing antireflective coating (ARC) is used (e.g., by spin-on application) to create a planar surface prior to the application and patterning of resist layer 126. It will be noted that the via for the bottom plate 108 is landed at a higher height than the via 130 connected to the lower wiring level 102. For both the capacitor trench and via RIE processes, a conventional chemistry may be modified in order to break thorough the liner/dielectric bilayer.

Figure 1I:
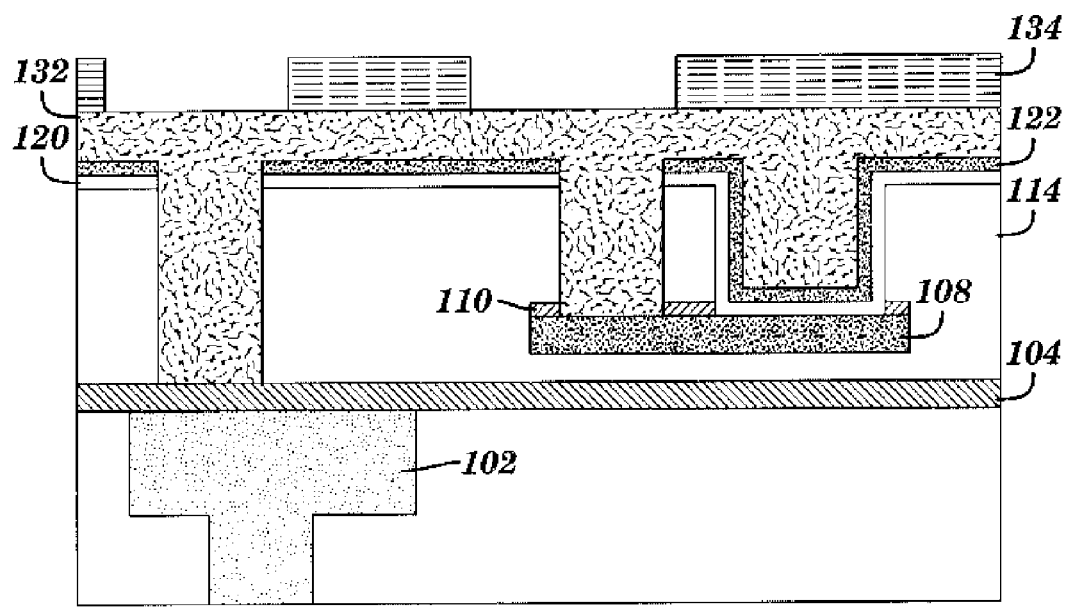
Figure 1J:
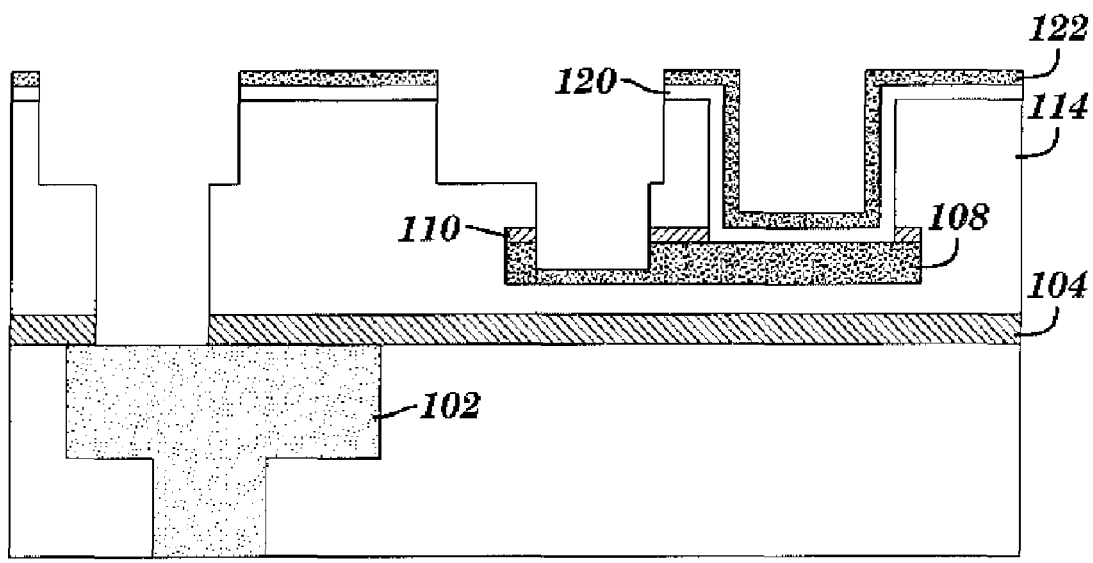

Continuing with multiple damascene processing, FIG. 1(i) illustrates the lithography portion for the upper wiring level formation. The device is again planarized using an ARC layer, followed by the application and patterning of resist layer 134. After the subsequent RIE of the exposed layers in FIG. 1(j), it will be noted that the bottom plate via 128 may slightly extend into the material of the bottom plate 108, while via 134 is extended through the barrier layer, landing on the lower wiring level 102. At this point, the residual capacitor dielectric 120 and protective layer 122 may be removed prior to metal fill. However, since debris from the removal could deposit within the open vias and capacitor trench, it is preferable to remove the excess capacitor dielectric 120 and protective layer 122 during planarization of the upper wiring level and top electrode metal.

Figure 1K:
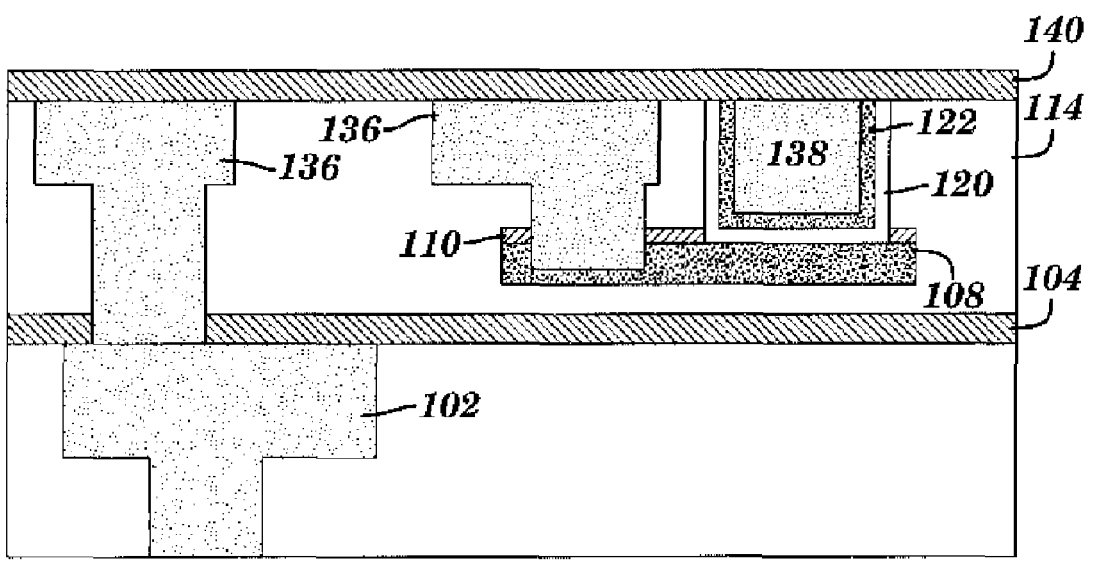

Finally, FIG. 1(k) illustrates the completed upper wiring level 136, including the main copper portion of the capacitor top electrode 138. The upper metal level may be formed by methods known in the art, including copper liner and seed deposition, followed by plating and planarization by chemical mechanical polishing (CMP), for example. A capping (barrier) layer 140 may then be formed over the upper wiring level 136 and top electrode 138, after which additional BEOL processing may continue.

Thus configured, a novel MIM capacitor structure is defined for integration within shrinking BEOL wiring levels. In one respect, the presently disclosed scheme retains the advantages of an existing MOD (MIM capacitor on dielectric) scheme by having the MIM cap lower electrode isolated from and independent of the lower wiring level by a sacrificial dielectric. However, in the present embodiments, only the bottom plate material is deposited prior to forming the next level ILD material, thus producing a thinner stack. However, unlike conventional integration schemes, the top plate of the MIM capacitor is patterned prior to the patterning of the next (upper) level metal, although the top plate is integrated within the upper wiring level.

A further advantage of the present scheme is the elimination of a via landing on the top plate, removing this as a source of loss in yield or reliability. Although the via RIE process still calls for landing on the bottom plate (and thus some selectivity is needed) an etch into a portion of bottom plate material is not of particular concern (unless there is a complete etch therethrough leading to poor contact resistance). Thus, the via height differences in the present embodiments need not be as severe as the conventional processes. Still a further advantage, as indicated earlier, is the lack of exposure of copper from the MOD type integration, and thus the ability to use high-k dielectrics. Further, unlike prior integration schemes, the MIM capacitor dielectric is not exposed to RIE damage from the end of the top plate RIE, thus removing one source of loss in reliability.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for integrating a metal-insulator-metal (MIM) capacitor in back end of line (BEOL) wiring levels of a semiconductor device, the method comprising:

forming an isolating layer over a lower wiring level;
   forming a bottom electrode of the capacitor on said isolating layer;
   forming an interlevel dielectric material on said isolating layer and said bottom electrode;
   patterning said interlevel dielectric material so as to define a capacitor trench, said capacitor trench stopping on said bottom electrode:
   forming a capacitor dielectric in said capacitor trench and on said bottom electrode, forming a protective liner over said capacitor dielectric and forming a top electrode of the capacitor on said capacitor dielectric, said protective liner further comprising a portion of said top electrode;
   wherein said top electrode is formed concurrently with an upper wiring level, said upper level being the next successive wiring level with respect to said lower wiring level, and wherein said bottom electrode is patterned and said interlevel dielectric is formed prior to forming said capacitor dielectric and said top electrode.

2. The method of claim 1, wherein said isolating layer further comprises an insulating layer formed over said lower wiring level.

3. The method of claim 1, wherein said isolating layer further comprises a barrier layer formed on said lower wiring level.

4. The method of claim 1, further comprising:
   defining a first via within said interlevel dielectric for landing on said bottom electrode; and
   defining a second via within said interlevel dielectric for landing on said lower wiring level;
   said first and second vias being defined subsequent to said capacitor trench formation.

5. The method of claim 4, further comprising defining upper wiring level trenches in said interlevel dielectric and over said first and second vias.

6. The method of claim 5, further comprising:
   filling said first and second vias, said upper wiring level trenches and said capacitor trench with a conductive fill material; and
   planarizing said conductive fill material so as to define said upper wiring level and said top electrode.

7. The method of claim 6, further comprising removing excess portions of said capacitor dielectric and said protective liner during said planarizing of said conductive fill material.

8. The method of claim 1, further comprising forming a barrier layer over said bottom plate, said barrier layer serving as an etch stop material during the formation of said capacitor trench and said first via.

* * * * *